United States Patent [19]

Okitaka

[11] Patent Number: 4,858,055
[45] Date of Patent: Aug. 15, 1989

[54] INPUT PROTECTING DEVICE FOR A SEMICONDUCTOR CIRCUIT DEVICE

[75] Inventor: Takenori Okitaka, Hyogo, Japan

[73] Assignee: Mitsubishi Denki Kabushiki Kaisha, Tokyo, Japan

[21] Appl. No.: 132,648

[22] Filed: Dec. 8, 1987

[30] Foreign Application Priority Data

Jul. 23, 1987 [JP] Japan .................. 62-184328

[51] Int. Cl.$^4$ .............................. H02H 9/04
[52] U.S. Cl. ........................ 361/91; 361/92; 361/90; 361/56; 307/549; 307/557; 307/560; 357/23.13
[58] Field of Search ............... 361/56, 88, 90, 91, 361/92, 111; 357/23.3, 23.13; 307/544, 549, 550, 551, 557, 558, 559, 564, 568, 560

[56] References Cited

U.S. PATENT DOCUMENTS

| | | | |
|---|---|---|---|
| 3,947,727 | 3/1976 | Stewart | 361/91 |
| 4,131,928 | 12/1978 | Davis et al. | 361/56 |
| 4,220,876 | 9/1980 | Ray | 307/559 X |
| 4,282,556 | 8/1981 | Ipri | 361/56 |
| 4,476,476 | 10/1984 | Yu et al. | 357/23.13 |
| 4,567,500 | 1/1986 | Avery | 307/545 X |
| 4,710,842 | 12/1987 | Suzuki et al. | 361/88 |
| 4,728,826 | 3/1988 | Einzinger et al. | 307/571 |
| 4,736,271 | 4/1988 | Mack et al. | 357/23.13 |

FOREIGN PATENT DOCUMENTS 3615690 5/1986 Fed. Rep. of Germany .
61-245562 10/1986 Japan .

OTHER PUBLICATIONS

E. Thibodeau, "Getting the Most Out of CMOS Devices for Analog Switching Jobs" *Electronic*, (Dec. 25, 1975): 69, 74.

Patent Abstracts of Japan, vol. 11, No. 95 (E-492) 3/25/87, vol. 11, No. 73 (E-486) 3/5/87, vol. 10, No. 359 (E-460) 12/3/86.

RCA Corporation, *RCA Solid State QMOS Data Book*, "QMOS Integrated Circuits", 1985. p. 469.

*Primary Examiner*—A. D. Pellinen
*Assistant Examiner*—H. L. Williams
*Attorney, Agent, or Firm*—Lowe, Price, LeBlanc, Becker & Shur

[57] ABSTRACT

An input protecting device of a semiconductor circuit device has a first power supply terminal (8) for providing a first supply potential, a second power supply terminal (9) for providing a second supply potential, a signal input terminal (1), a first clamping diode (3) provided between the first power supply terminal (8) and the signal input terminal (1) for clamping a voltage larger than the first supply potential applied to the signal input terminal (1), and a second clamping diode (4) provided between the second power supply terminal (9) and the signal input terminal (1) for clamping a voltage smaller than the second supply potential applied to the signal input terminal (1). A switching device (12, 20 or 33) selectively cuts off a current path between the first clamping diode (3) and the signal input terminal (1) when a voltage is not applied to the first power supply terminal (8). As a result, even if a signal at "H" level is applied to the signal input terminal (1) when the supply potential is not applied to the first power supply terminal (8), a current is prevented from flowing in from the signal input terminal (1) through the first clamping diode (3).

6 Claims, 5 Drawing Sheets

INPUT PROTECTING DEVICE FOR A SEMICONDUCTOR CIRCUIT DEVICE

BACKGROUND OF THE INVENTION

1. Field of the Invention

The present invention relates to a structure of an input protecting device provided in a signal input portion of a semiconductor circuit device.

2. Description of the Prior Art

FIG. 1 is a view showing a structure of a complementary MOS integrated circuit with a conventional input protecting circuit. Referring to FIG. 1, is shown an input portion of a system S2 which comprises, for example, a printer and the like operating in response to an output from a system S1 which comprises, for example, a micro computer and the like. The system S1 comprises in an output portion thereof an output buffer formed of an inverter having a P-channel MOS transistor T1 and an N-channel MOS transistor T2 connected in a complementary manner. An output signal from the system S1 is applied to an input terminal 1 of the system S2 through the output buffer. The system S2 comprises in the input portion a first clamping diode 3 connected between the input terminal 1 and a first power supply terminal 8 for clamping a voltage applied to the input terminal 1 to a predetermined voltage in case that the applied voltage is larger than a first predetermined voltage value, a second clamping diode 4 connected between the signal input terminal 1 and a second power supply terminal 9 for clampling the voltage applied to the signal input terminal 1 to a predetermined voltage in case that the applied voltage is smaller than a second predetermined voltage value, an input protective resistor 5 connected to a connecting point of the clamping diodes 3 and 4, and an inverter (input buffer) comprising a P-channel MOS transistor 6 and an N-channel MOS transistor 7 for outputting, after inversion, a signal received through the input protective resistor 5. An inverter output is applied to an internal circuit (not shown) through an internal output terminal 2, so that the internal circuit operates in response to a signal provided. The system S1 generates an internal supply potential $V_{CC}$ in response to a supply potential from an external power supply $V_A$. The potential $V_{CC}$ is used as an operation supply potential for the system S1. The system S2 receives a supply potential from an external power supply $V_B$ on the power supply terminal 8 and then generates the internal supply potential $V_{CC}$ which is used as an operation supply potential. Assuming that the potential $V_{CC}$ applied to the first power supply terminal 8 is positive potential and a potential second power supply terminal 9 is a ground potential in the system S2, an operation is now described. The system S2 operates in response to an output signal of the system S1. In this case, let it be assumed that an operation supply potential is supplied to respective systems S1 and S2 via the respective external power supplies $V_A$ and $V_B$. At this time, the input clamping diode 3 functions to clamp an input voltage to a level of "(supply potential $V_{CC}+V_F$)" when an overvoltage higher than the supply potential $V_{CC}$ is applied to the input terminal 1 of the system S2. The $V_F$ shows a forward voltage drop of the input clamping diode 3. On the other hand, the input clamping diode 4 functions to clamp an input voltage to a level of "(ground potential $-V_F$)" when a voltage lower than a ground potential is applied to the input terminal 1. This prevents the overvoltage from being supplied to the inverter stage and the internal circuit.

The above-mentioned description was made, assuming that forward voltage drops of both input clamping diodes 3 and 4 are equally $V_F$.

A conventional input protecting circuit in the system S2 performs the above-mentioned operation. Therefore, an input protecting function can be achieved when an operation supply potential is supplied to both systems S1 and S2. However, for example, if the system S1 is a personal computer and the system S2 is a printer serving as an external apparatus, it could happen that the power supply $V_A$ is supplied to the system S1 while the operation supply potential is not supplied from the external power supply $V_B$ to the system S2. In this case, that is, when the operation supply potential $V_{CC}$ is not applied to the power supply terminal 8 of the system S2, a case could happen in which a signal of "H" level is applied from the system S1 to the signal input terminal 1. In this case, a current continues to flow from the input terminal 1 to the power supply terminal 8 through the input clamping diode 3, since the power supply terminal 8 is at "L" level. Therefore, in this state, it becomes a large load for a power supply (i.e., a power supply for supplying the operation supply potential of the system S1) supplying a signal of "H" level to the input terminal 1. In addition, there were problems in which the potential of the power supply terminal 8 rises and the internal circuit of the system S2 erroneously operates due to the raised potential, when an input impedance of a power supply providing the operation supply potential to the power supply terminal 8 is high. Therefore, there were problems in which a semiconductor circuit device with an input protecting circuit structured by using the conventional input clamping diodes can not be used in an interface portion of a system.

Furthermore, in order to avoid the above-mentioned malfunction, a method of structuring an I/O portion using bipolar transistors can be considered, but in this case, problems are caused in which a consumed power becomes large.

A structure of an input protecting circuit with the above-mentioned input clamping diodes is shown, for example, in page 469 of *RCA Solid State Q MOS Data Book*.

SUMMARY OF THE INVENTION

Therefore, it is an object of the present invention to remove a defect of an input protecting circuit with the above-mentioned conventional input clamping diodes, and to provide a semiconductor circuit device provided with an input protecting device in which a current will not flow from an input terminal to a power supply terminal even if the signal of "H" level is applied to the input terminal when no voltage is applied to the power supply terminal by using a MOS transistor.

An input protecting device of a semiconductor circuit device in accordance with the present invention comprises a switching transistor provided between an input clamping diode and a signal input terminal such that on-off control for the switching transistor can be performed in response to a voltage applied to a first power supply terminal in order to control a conduction/cut-off of a current path of the input clamping diode provided between the first power supply terminal and the signal input terminal.

An input protecting device of a semiconductor circuit device of the present invention comprises a switching transistor provided between an input clamping diode and a signal input terminal, the switching transistor being rendered to be in an off-state when a voltage is not applied to the first power supply terminal, so that a current path between the signal input terminal and the first power supply terminal is cut-off, whereby a current is prevented from flowing from the input clamping diode to the power supply terminal 8 in case that a signal of "H" level is applied to an input terminal when a supply potential is not applied to the power supply terminal.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
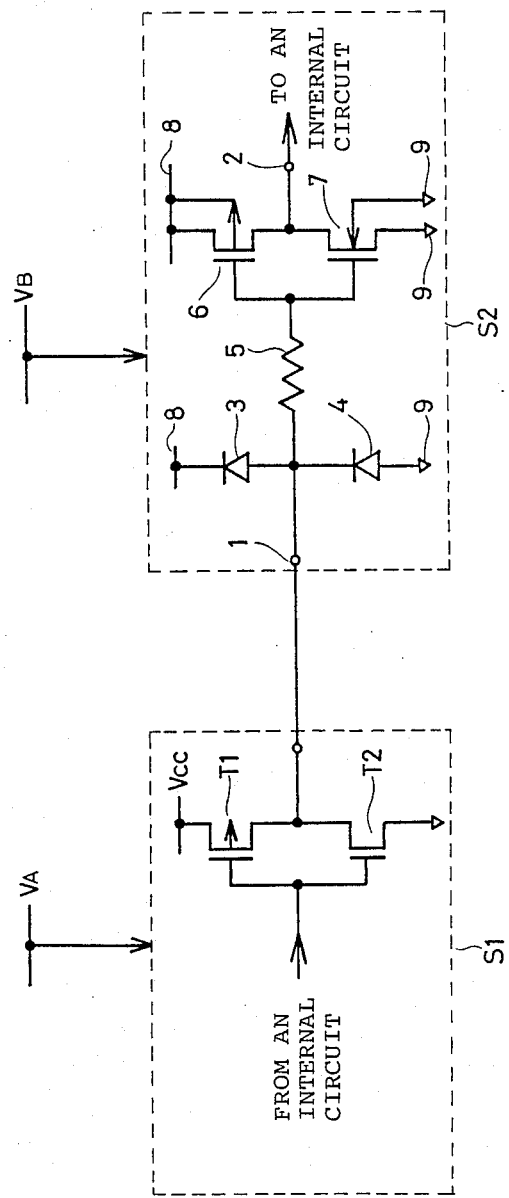
FIG. 1 is a diagram showing one example of a configuration in which the semiconductor circuit device comprising a conventional input protecting circuit is applied to an interface of a system.
Figure 2:
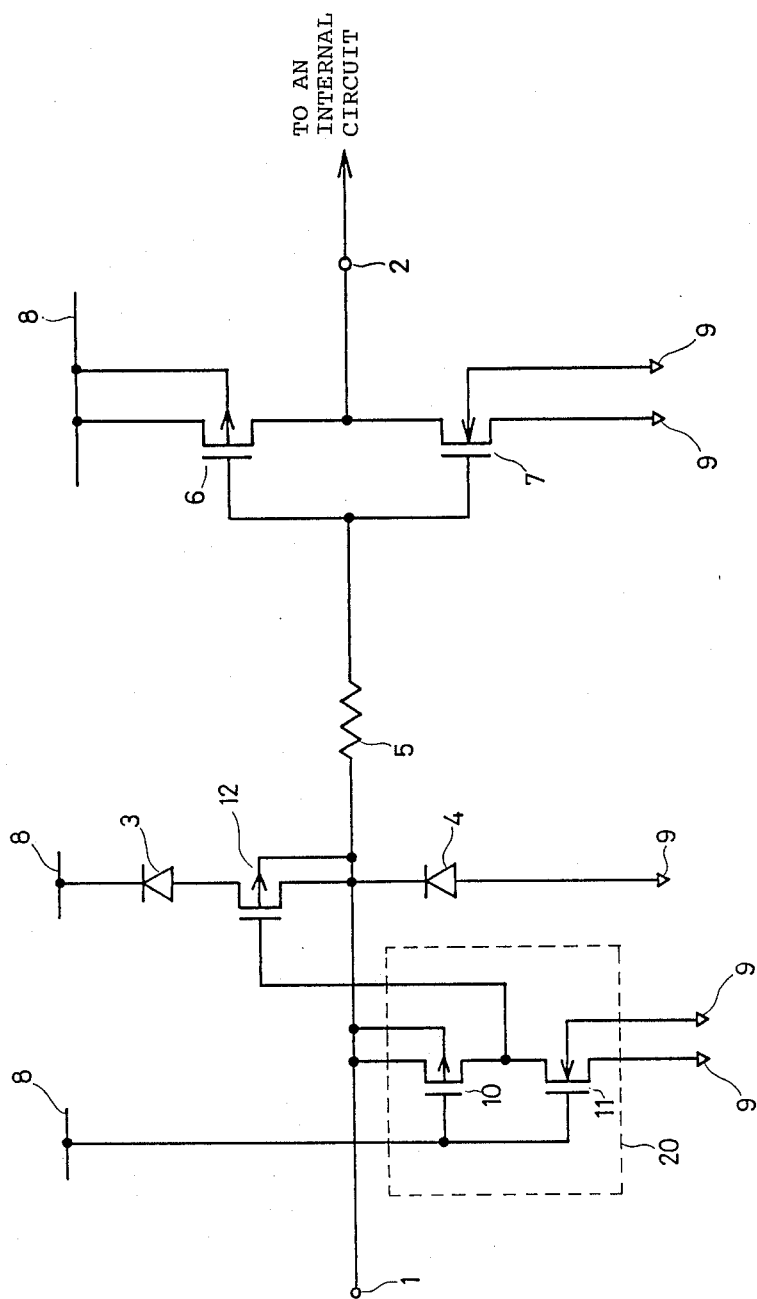
FIG. 2 is a diagram showing an example of a configuration of an input protecting circuit according to one embodiment of the present invention.

FIG. 2 is a diagram showing a configuration of an input protecting circuit of a semiconductor circuit device according to one embodiment of the present invention, in which the same reference numerals are used for the same or corresponding portions as the conventional input protecting circuit shown in FIG. 1.

As shown in FIG. 2, an input protecting circuit according to one embodiment of the present invention comprises a P-channel MOS transistor 12 connected between an input clamping diode 3 for clamping a high-voltage and the input terminal 1, and a control circuit 20 for controlling an on-off operation of the P-channel MOS transistor 12 in response to the voltage applied to the first power supply terminal 8. The control circuit 20 comprises a P-channel MOS transistor 10 having a gate connected to the first power supply terminal 8, both one conduction terminal and a substrate (or a well) connected to the input terminal 1, and other conduction terminal serving as an output portion, an N-channel MOS transistor 11 having a gate connected to the first power supply terminal 8, one conduction terminal connected to the other conduction terminal of the P-channel MOS transistor and both other conduction terminal and a well (or a substrate) connected to a second supply potential (a ground potential in the present embodiment). Other configuration is the same as that of the conventional input protecting circuit shown in FIG. 1.

Figure 3:
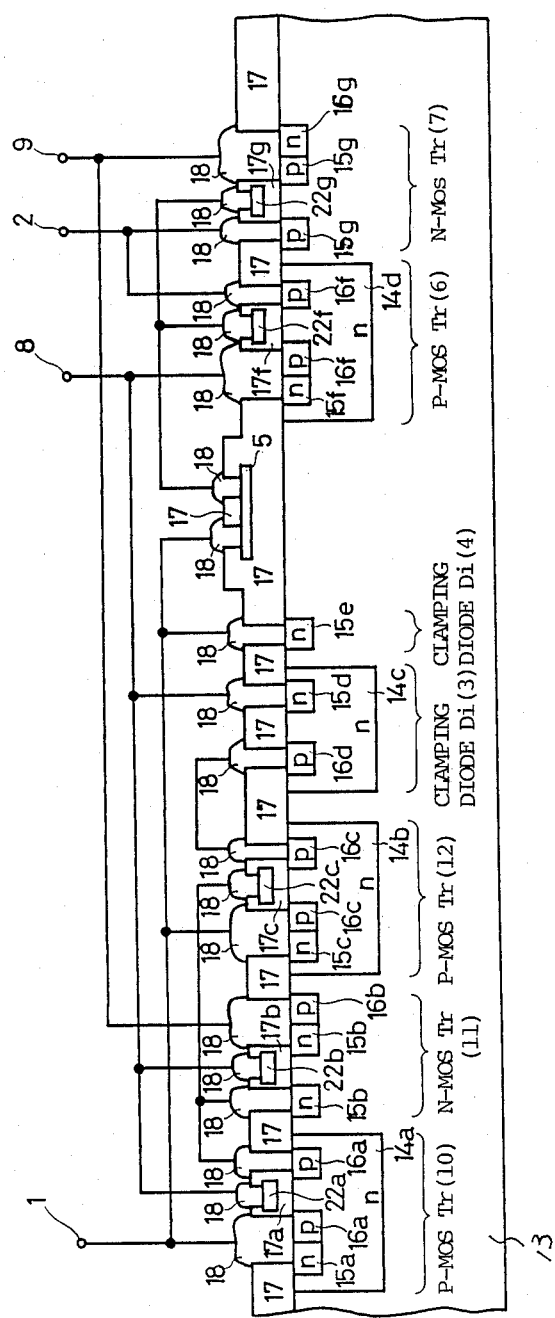
FIG. 3 is a sectional view showing a structure of an input protecting circuit shown in FIG. 2.

FIG. 3 is a diagram showing a sectional structure in applying an input protecting circuit shown in FIG. 2 to an input portion of a complementary MOS integrated circuit using a P-type semiconductor substrate. Referring to FIG. 3, the P-channel MOS transistor 10 included in the control circuit 20 is structure in a region of an N-type well 14a formed on the surface of P-type substrate 13. More specifically, the P-channel MOS transistor 10 comprises P-type impurity diffused regions (source and drain) 16a formed in the N well 14a and a gate electrode 22a formed on a gate insulating film 17a. An N-type impurity diffused region 15a for applying a well potential to the N-type well 14a and the P-type impurity diffused region 16a are connected to the signal input terminal 1.

The N-channel MOS transistor 11 included in the control circuit 20 comprises N-type impurity diffused regions 15b to be a source and a drain and a gate electrode 22b formed on a gate insulating film 17b. A P-type impurity diffused region 16b is electrically connected with a P-type semiconductor substrate 13 for applying a substrate potential. One of the N-type impurity diffused regions 15b and the P-type impurity diffused region 16b of the N-channel MOS transistor 11 are connected to a second supply potential through a terminal 9. A P-channel MOS transistor 12 serving as a switching transistor for controlling a cut-off/conduction of a current path of the input clamping diode 3 is formed in an N well 14b. More specifically, the P-channel MOS transistor 12 comprises P-type impurity diffused regions 16c to be a source and a drain and a gate electrode 22c formed on a gate insulting film 17c.

An N-type impurity diffused region 15c is provided for electrical contact with the N-well 14b. The N-type impurity diffused region 15c and one of the P-type impurity diffused regions 16c are connected to the signal input terminal 1. The input clamping diode 3 for high-voltage clamping is formed in an N-well 14c. More specifically, it comprises a P-type impurity diffused region 16d forming an anode and an N-type impurity diffused region 15d forming a cathode. The P-type impurity diffused region 16d is connected to the other P-type impurity diffused region 16c of the P-channel MOS transistor 12. The N-type impurity diffused region 15d is connected electrically to the first power supply terminal 8 as well as to the N-well 14c. The input clamping diode 4 for low-voltage clamping is formed of an N-type impurity diffused region 15e. The input clamping diode 4 comprises the N-type impurity diffused region 15e and the P-type semiconductor substrate 13. The N-type impurity diffused region 15e is connected to the signal input terminal 1.

The input protecting resistor 5 is formed using polysilicon.

The P-channel MOS transistor 6 of an inverter constituting an input buffer is formed in an N-well 14d. More specifically, the P-channel MOS transistor 6 comprises P-type impurity diffused regions 16f to be a source and a drain and a gate electrode 22f formed on a gate insulating film 17f. An N-type impurity diffused region 15f is provided for making electric contact with the N-well 14a. One of the P-type impurity diffused regions 16f and the N-type impurity diffused region 15f are connected to the first power supply terminal 8. The other P-type impurity diffused region 16f is connected to the output terminal 2.

The N-channel MOS transistor 7 of the inverter stage comprises a P-type impurity diffused regions 15g and a gate electrode 22g formed on a gate insulating film 17g. An N-type impurity diffused region 16g is also provided for making electric contact with the semiconductor substrate 13. One of the P-type impurity diffused regions 15g is connected to the output terminal 2. The other P-type impurity diffused region 15g and the N- type impurity diffused region 16g are connected to a ground potential, for example, through the second power supply terminal 9. A reference numeral 17 denotes an interlayer insulating film and a reference numeral 18 denotes an electrode formed of, for example, aluminum.

A P-type semiconductor substrate is used herein for connecting to the signal input terminal 1 a substrate (that is, a well 14a) and one conduction terminal of the P-channel MOS transistor 10 included in the control circuit 20. An input protecting circuit in a CMOS integrated circuit with a desired operational characteristics can be structured in this way. Next, referring to FIG. 1, an operation of an input protecting circuit according to one embodiment of the present invention is now described.

Now, a description is made as to the case in which the positive supply potential $V_{CC}$ is applied to the first power supply terminal 8. At this time, the P-channel MOS transistor 10 is in an off-state, and the N-channel MOS transistor 11 is an on-state in the control circuit 20, so that a signal of "L" level is generated from the control circuit 20 to be applied to the gate of the P-channel MOS transistor 12. Thus, the P-channel MOS transistor 12 is rendered to be in an on-state. Therefore, an input voltage can be clamped to the level of "$(V_{CC}+V_F+V_{TH})$" by the input clamping diode 3 even if an overvoltage higher than the supply potential $V_{CC}$ is applied to the signal input terminal 1 when the operation supply potential $V_{CC}$ is applied to the first power supply terminal 8. Reference character $V_F$ represents a forward potential drop of the clamping diode 3 and $V_{TH}$ represents a threshold voltage of the P-channel MOS transistor 12. Also, an input voltage is clamped to the level of "(a ground potential $-V_F$)" by the input clamping diode 4 in case that a voltage lower than a ground potential is applied to the signal input terminal 1 when the supply potential $V_{CC}$ is applied to the first power supply terminal 8. Therefore, an input voltage can be clamped to a predetermined potential even if an overvoltage is applied, under the condition in which the operation supply potential $V_{CC}$ is applied to the first power supply terminal 8.

Next, a description is made as to the case in which the operation supply potential $V_{CC}$ is not applied to the power supply terminal 8 and the power supply terminal 8 is at "L" level. The case in which under such condition the signal at "H" level is applied from an external system to the signal input terminal 1 is now described. In this state, the P-channel MOS transistor 10 is in an on-state and the N-channel MOS transistor 11 is in an off-state in the control circuit 20, and accordingly the P-channel MOS transistor 12 is in an off-state. Therefore, a current will not flow from the signal input terminal 1 to the power supply terminal 8 even if the signal at "H" level is applied to the signal input terminal 1 in this state because a current path from the signal input terminal 1 to the first power supply terminal 8 through the input clamping diode 3 is cut off.

A case could be considered in which a voltage applied from the external system to the signal input terminal 8 includes a surge voltage when a voltage is not applied to the power supply terminal 8, that is, the power supply terminal 8 is at "L" level. In this case, a punch-through occurs in the MOS transistor 11 included in the control circuit 20 and the MOS transistor 12 is rendered to be in an on-state in response to a signal from the control circuit 20, and in any case, it is possible to absorb the surge.

Description is made as to a transient operation in case a surge voltage is applied when the operation supply potential $V_{CC}$ is applied to the power supply terminal 8. Let it be assumed that the MOS transistor 10 and MOS transistor 11 are formed in the same size.

Figure 4:
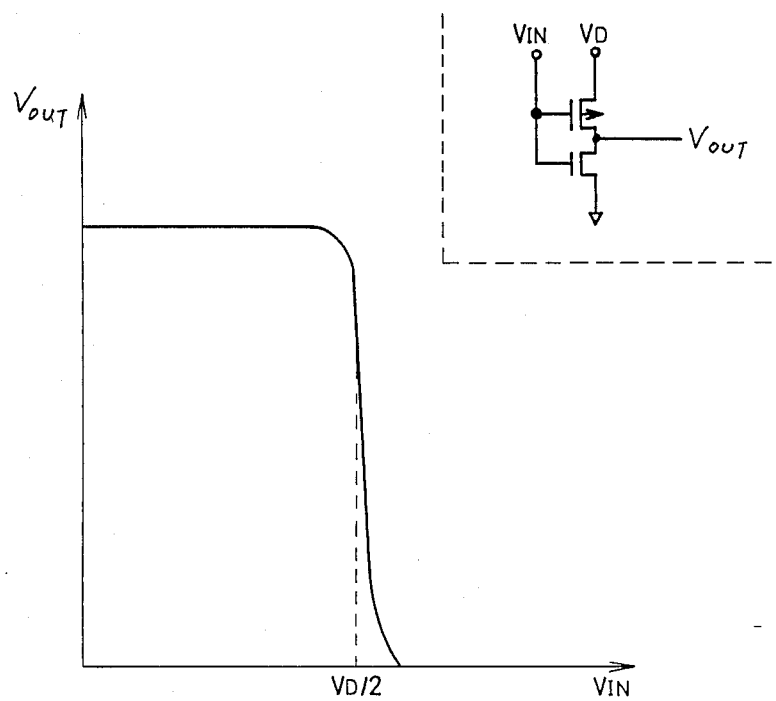
FIG. 4 is a diagram showing an input-output voltage characteristics of a CMOS inverter.

Usually, a characteristics of input voltage and output voltage of a MOS inverter is to be as shown in FIG. 4. More specifically, an input threshold voltage of a CMOS inverter is set to a half of an operation supply potential $V_D$. Therefore, the P-channel MOS transistor 12 is rendered to be in an off-state when the operation supply potential $V_{CC}$ is applied to the power supply terminal 8 and a surge voltage higher than 2 $V_{CC}$ is applied to the signal input terminal 1 because the operational supply potential $V_{CC}$ applied to the power supply terminal 8 is determined as an input signal of "L" level by an inverter of the control circuit 20, as seen from the input/output voltage characteristic in FIG. 4. In this state, however, a punch-through occurs in the MOS transistor 11 included in the control circuit 20, so that a surge voltage is absorbed through the second power supply terminal 9.

On the other hand, when a signal lower than the operation supply potential 2 $V_{CC}$ is supplied to the signal input terminal 1 in this state, the P-channel MOS transistor 12 becomes an on-state since the operation supply potential $V_{CC}$ is determined to be at "H" level by the inverter of the control circuit 20, and in such state, a clamp is effected to an input signal through the clamping diode 3.

A logical threshold voltage of the inverter included in the control circuit 20 can be set to a desired value by selecting appropriately a size of the transistors 10 and 11 (ratio of on-risistances or ratio of a gate length and a gate width), and an input protecting circuit capable of absorbing a surge voltage positively can be implemented.

In the above-mentioned embodiment, although a case in which an input buffer is formed of one stage inverter was described, there is also a case in which an input buffer is formed of two staged inverters. The present invention is applicable to such case.

Figure 5:
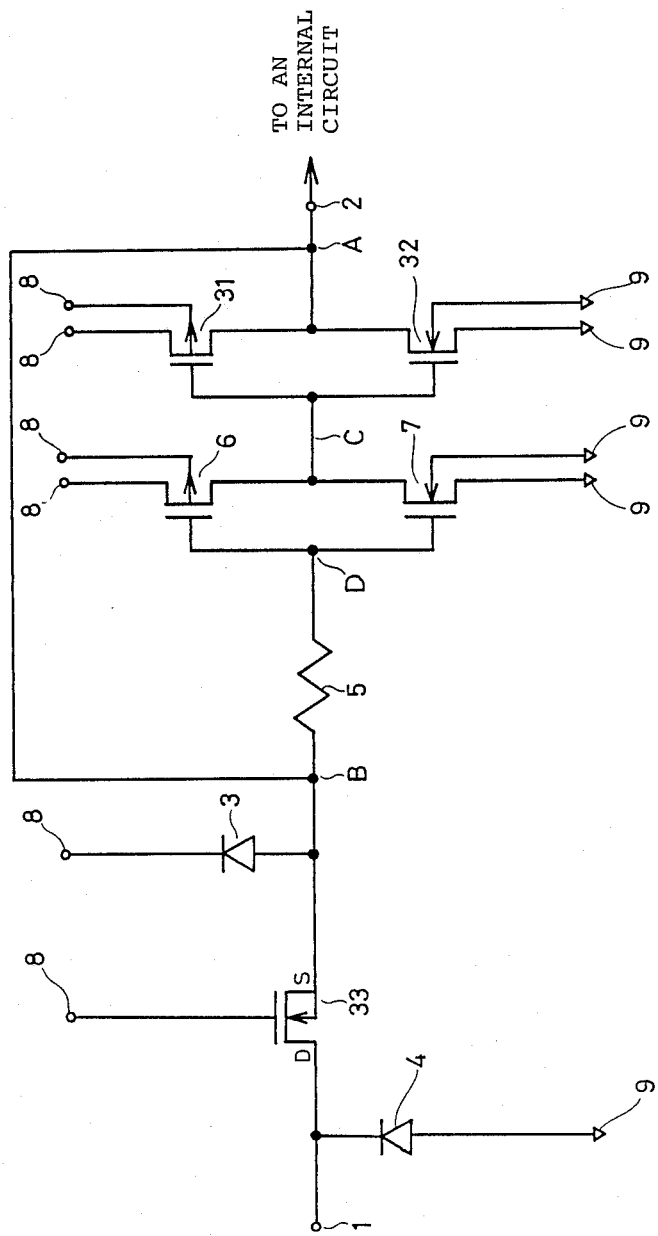
FIG. 5 is a diagram showing a configuration of an input protecting circuit of another embodiment of the present invention.

FIG. 5 is a diagram showing a structure of an input protecting circuit of another embodiment of the present invention. Referring to FIG. 5, a structure and an operation of another embodiment of the present invention are now described.

The input protecting circuit shown in FIG. 5 comprises an input buffer formed of two staged inverters. That is, the input buffer comprises a first inverter comprising the P-channel MOS transistor 6 and the N-channel MOS transistor 7, and a second inverter comprising a P-channel MOS transistor 31 and an N-channel MOS transistor 32.

The P-channel MOS transistor 31 has a gate connected to the output portion c of the first inverter, one conduction terminal and a substrate (or a well) connected to the first power supply terminal 8, and the other conduction terminal connected to the internal output terminal 2. The N-channel MOS transistor 32 has a gate connected to the output c of the first inverter, one conduction terminal connected to the output terminal 2, and the other conduction terminal and a substrate (or a well) connected to the second power supply terminal 9.

A structure of the two staged inverters is such that a signal in phase with the signal applied to the signal input terminal 1 is applied to the output terminal 2.

In order to conduct/cut-off the current path between the signal input terminal 1 and the input clamping diode 3 for high-voltage in response to the voltage applied to the first power supply terminal 8, the N-channel MOS transistor 33 is provided between the signal input terminal 1 and the input clamping diode 3. The N-channel MOS transistor 33 has a drain connected to the signal input terminal 1, a gate connected to the first power supply terminal 8, and a source and a substrate (or a well) both connected to the anode of the input clamping diode 3 and to one terminal of the input protecting resistor 5.

In addition, in order to remove the influence exerted on the input signal by a threshold voltage $V_{TH}$ of the N-channel MOS transistor 33, a node A (the output of the second inverter) and a node B (one terminal of the resistor 5) are connected by a conductor 34. Next, an operation is described.

First, a description is made as to a case in which the positive source potential $V_{CC}$ is applied to the first power supply terminal 8. At that time, the N-channel MOS transistor 33 is in an on-state. Therefore, when the signal at "H" level is applied to the signal input terminal 1, the voltage $V_D$ of the gates (node D) of the MOS transistor 6 and 7 also becomes "H" level. However, if the voltage $V_{IN}$ of the signal applied to the signal input terminal 1 and the first power source potential $V_{CC}$ satisfy the relation, $$V_{IN}=V_{CC},$$

the level of the voltage $V_D$ applied to the gate (node D) of the MOS transistor 6 and 7 never becomes higher than the value of $V_{CC}-V_{TH}$. Here, $V_{TH}$ represents the threshold voltage of the transistor 33. In such case, since a signal level transferred to the output terminal 2 could become unstable, a voltage drop due to the threshold voltage $V_{TH}$ of the MOS transistor 33 is to be compensated by feeding the voltage level at the node A back to the node B by means of a conductor 34. As a result, the level of the voltage $V_D$ applied to the gates (node D) of the MOS transistor 6 and 7 can be set to the level of the supply potential $V_{CC}$.

If an excessive surge voltage larger than the supply potential $V_{CC}$ is applied to the signal input terminal 1, the MOS transistor 33 causes a punch-through and, as a result, a surge voltage can be drawn out through the clamping diode 3.

Then, when the signal at "L" level is applied to the signal input terminal 1, the gate voltage $V_D$ of the MOS transistor 6 and 7 also becomes "L" level. However, if the voltage $V_{IN}$ of the input signal is equal to the ground potential $V_{GND}$, the level of the voltage $V_D$ applied to the gate (node D) of the MOS transistor 6 and 7 never becomes less than the value of $$V_{GND}+V_{TH}.$$

Also, in this case, the signal level transferred to the output terminal 2 could become unstable. An influence of the threshold voltage $V_{TH}$ of the MOS transistor 33 is removed by feeding back the voltage of the node A to the node B through the conductor 34 and, as a result, the voltage $V_D$ applied to the gates (node D) of the MOS transistor 6 and 7 can be reduced to the ground potential $V_{GND}$.

If an excessive surge less than the ground potential $V_{GND}$ is applied to the signal input terminal 1, the surge can be drawn out through the clamping diode 4.

Next, a description is made as to a case in which the supply potential $V_{CC}$ is not applied to the first power supply terminal 8, that is, the voltage level of the power supply terminal 8 is at "L" level. At that time, MOS transistor 33 is in an off-state and the current path between the input clamping diode 3 and the signal input terminal 1 is cut off. Therefore, even if the signal at "H" level is applied to the signal input terminal 1 when the supply potential $V_{CC}$ is not applied to the power supply terminal 1, a current never flows in through the clamping diode 3.

Furthermore, if a surge is applied to the signal input terminal 1 in this state, a surge voltage can be drawn out through the clamping diode 3 by the punch-through of the MOS transistor 33 when it is larger than the supply potential $V_{CC}$ and a surge voltage can be drawn out by the clamping diode 4 when a surge less than the ground potential $V_{GND}$ is applied.

Meanwhile, although in the above-mentioned embodiment a case was described as one example in which an input protecting circuit is provided in an input portion of a complementary MOS integrated circuit, the same effect as that of the above-mentioned embodiment can be obtained if an input protecting circuit of the present invention is applied to other type of semiconductor integrated circuit such as PMOS, NMOS or Bi-CMOS integrated circuit as far as an integrated circuit comprises an input protecting circuit having an input clamping diode.

In addition, although in the above-mentioned embodiment, a case was described in which polysilicon is used as the input protecting resistor 5, it can be formed using a diffused region with the same effect as that of the above-mentioned embodiment.

As described in the foregoing, according to the present invention, a current path to a signal input terminal and a power supply terminal is cut off when a supply potential is not applied, so that current-flow from a signal input terminal to a power supply terminal can be prevented even if a signal of "H" level is applied to the signal input terminal in this state, so that a semiconductor circuit device including an input protecting circuit having an input clamping diode can be used in an interface portion of a system.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An input protecting device of a semiconductor circuit device comprising:
   a signal input terminal;
   first and second power supply terminals;
   a first clamping diode provided between said first power supply terminal and said signal input terminal;
   a second clamping diode provided between said second power supply terminal and said signal input terminal;
   switching means provided between said first clamping diode and said signal input terminal for selectively cutting off a current path between said first clamping diode and said signal input terminal; and controlling means responsive to a voltage applied to said first power supply terminal and connected to said control terminal of said switching means for controlling an on-off condition thereof.

2. An input protecting device of a semiconductor circuit device in accordance with claim 1, wherein said control means (20) renders said switching means (12) in an off-state when a voltage is not applied to said first power supply terminal (8).

3. An input protecting device of a semiconductor circuit device in accordance with claim 1, wherein if a voltage is applied to said first power supply terminal (8), said controlling means (20) renders said switching means (12) in an off-state when the voltage applied to said input terminal (1) is higher than the voltage applied to said first voltage supply terminal (8) multiplied by a predetermined value, and renders said switching means (12) in an on-state when the voltage applied to said input terminal is lower than the voltage applied to said first voltage supply terminal (8) multiplied by the predetermined value.

4. An input protecting device of a semiconductor circuit device comprising:
a signal input terminal;
first and second power supply terminals;
a first clamping diode provided between said first power supply terminal and said signal input terminal;
a second clamping diode provided between said second power supply terminal and said signal input terminal;
switching means provided between said first clamping diode and said signal input terminal for selectively cutting off a current path between said first clamping diode and said signal input terminal; and
controlling means responsive to a voltage applied to said first power supply terminal and connected to said control terminal of said switching means for controlling an on-off condition thereof, said controlling means including:
a first conductivity type MOS transistor having a gate connected to said first power supply terminal, a first conduction terminal connected to said input terminal and a second conduction terminal serving as an output portion, the substrate of said first MOS transistor being coupled to said signal input terminal; and
a second conductivity type MOS transistor having a gate connected to said first power supply terminal, a first conduction terminal connected to the second conduction terminal of said first MOS transistor and a second conduction terminal connected to said second power supply terminal.

5. An input protecting device of a semiconductor circuit device comprising:
a signal input terminal;
first and second power supply terminals;
a first clamping diode provided between said first power supply terminal and said signal input terminal;
a second clamping diode provided between said second power supply terminal and said signal input terminal;
switching means provided between said first clamping diode and said signal input terminal for selectively cutting off a current path between said first clamping diode and said signal input terminal; and
means responsive to a voltage applied to said first power supply terminal and connected to said control terminal of said switching means for controlling an on-off condition thereof,
wherein said switching means comprises a third MOS transistor of said first conductivity type.

6. An input protecting device of a semiconductor circuit device in accordance with claim 5, wherein said first clamping diode (3) has an anode and a cathode wherein the cathode is connected to said first supply terminal (8), and said third MOS transistor (12) has one conduction terminal connected to the anode of said first clamping diode (3), the other conduction terminal and a substrate connected to said signal input terminal and a gate receiving an output from said control means.

* * * * *